US010355685B2

(12) United States Patent
Iida et al.

(10) Patent No.: US 10,355,685 B2
(45) Date of Patent: Jul. 16, 2019

(54) OUTPUT CIRCUIT

(71) Applicant: SOCIONEXT INC., Kanagawa (JP)

(72) Inventors: Masahisa Iida, Yokohama (JP); Masahiro Gion, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/001,199

(22) Filed: Jun. 6, 2018

(65) Prior Publication Data

US 2018/0287600 A1    Oct. 4, 2018

Related U.S. Application Data

(63) Continuation of application No. PCT/JP2016/084466, filed on Nov. 21, 2016.

(30) Foreign Application Priority Data

Dec. 8, 2015  (JP) ................................. 2015-239569

(51) Int. Cl.
*H03K 17/04* (2006.01)
*H03K 17/687* (2006.01)
(Continued)

(52) U.S. Cl.
CPC ........... *H03K 17/04* (2013.01); *H03K 17/687* (2013.01); *H03K 19/017* (2013.01);
(Continued)

(58) Field of Classification Search
CPC ............... H03K 17/04; H03K 17/0403; H03K 17/0406; H03K 17/041; H03K 17/04106;
(Continued)

(56) References Cited

U.S. PATENT DOCUMENTS

| 2004/0155693 A1* | 8/2004 | Ito ........................ H03K 3/011 327/333 |
| 2012/0268182 A1* | 10/2012 | Lee .................. H03K 3/356121 327/199 |
| 2013/0128655 A1* | 5/2013 | Cheng ...................... G11C 8/10 365/154 |

FOREIGN PATENT DOCUMENTS

| JP | H07-226663 A | 8/1995 |
| JP | 2000-083371 A | 3/2000 |

(Continued)

OTHER PUBLICATIONS

International Search Report issued in Application No. PCT/JP2016/084466 dated Feb. 7, 2017, with English translation.

(Continued)

*Primary Examiner* — Patrick C Chen
(74) *Attorney, Agent, or Firm* — McDermott Will & Emery LLP

(57) ABSTRACT

An output transistor (2) has a source connected to a VDD1 and a drain connected to an output terminal (1). A pre-driver (3) receives a signal varying in accordance with a data input signal (DIN), and provides a gate signal (SG1) to a gate of the output transistor (2), the gate signal (SG1) transiting between the VDD1 and a potential (VP) at a power source end (4). When a VDD2 is output from an output node (N1) and an assist signal (SA) makes a first transition corresponding to the transition of the gate signal (SG1) from HIGH to LOW, the drive assist circuit (20) performs an assist operation in which a potential of the output node (N1) is temporarily brought down from VDD2.

13 Claims, 9 Drawing Sheets

(51) Int. Cl.
*H03K 19/017* (2006.01)
*H03K 19/0175* (2006.01)
*H03K 19/0944* (2006.01)
*H03K 19/0185* (2006.01)

(52) U.S. Cl.
CPC . *H03K 19/0175* (2013.01); *H03K 19/017509* (2013.01); *H03K 19/018521* (2013.01); *H03K 19/0944* (2013.01)

(58) Field of Classification Search
CPC ......... H03K 17/04113; H03K 17/0412; H03K 17/04123; H03K 17/04126; H03K 17/0414; H03K 17/0416; H03K 17/04163; H03K 17/04166; H03K 17/687; H03K 17/6871; H03K 17/6872; H03K 17/6874; H03K 17/6877; H03K 19/017; H03K 19/01707; H03K 19/01714; H03K 19/01721; H03K 19/01728; H03K 19/01735; H03K 19/01742; H03K 19/0175; H03K 19/017509; H03K 19/017518; H03K 19/0944; H03K 19/09441; H03K 19/09443; H03K 19/09445; H03K 19/09446; H03K 19/09448
USPC ....................................................... 327/100
See application file for complete search history.

(56) References Cited

FOREIGN PATENT DOCUMENTS

| | | |
|---|---|---|
| JP | 2000-307406 A | 11/2000 |
| JP | 2005-167901 A | 6/2005 |
| JP | 2007-060201 A | 3/2007 |

OTHER PUBLICATIONS

Written Opinion issued in International Application No. PCT/JP2016/084466 dated Feb. 7, 2017, with partial English translation.

* cited by examiner

OUTPUT CIRCUIT

CROSS-REFERENCE TO RELATED APPLICATIONS

This is a continuation of International Application No. PCT/JP2016/84466 filed on Nov. 21, 2016, which claims priority to Japanese Patent Application No. 2015-239569 filed on Dec. 8, 2015. The entire disclosures of these applications are incorporated by reference herein.

BACKGROUND

The present disclosure relates to an output circuit to be used for a semiconductor integrated circuit device.

In a semiconductor integrated circuit device, an interface circuit for inputting and outputting a signal from and to an external device is required to operate at a high speed with low power consumption. In order to achieve high speed operation as well as low power consumption, a transistor to be used as an I/O transistor operates on a low voltage of, for example, 1.8 V. Meanwhile, the interface circuit needs to be operable to input and output a high voltage signal of, for example, 3.3 V.

Japanese Unexamined Patent Publication No. 2007-60201 discloses a technique to implement an output circuit outputting a high voltage signal outside, using a transistor operating on a low voltage. In this technique, the low-voltage transistor is connected in a cascade between a high-voltage power source and an output pad to relieve a source-drain voltage of the low-voltage transistor. A p-type transistor driving an output signal has (i) a source connected to the high-voltage power source, (ii) a drain connected to the output pad via another transistor, and (iii) a gate provided with a signal transiting between a high voltage and a low voltage.

However, the technique disclosed in Japanese Unexamined Patent Publication No. 2007-60201 could cause an increase in delay of the output signal when an externally supplied power source voltage varies. Specifically, a gate-source voltage, which switches the p-type transistor driving the output signal into a conductive state, is equivalent to the difference between a voltage of the high-voltage power source and a voltage of a low-voltage power source. However, this gate-source voltage significantly decreases when the voltage of the high-voltage power source drops and the voltage of the low-voltage power source rises. The drop in the gate-source voltage when the p-type transistor goes to the conductive state leads to a decrease in driving capability of the p-type transistor, eventually causing an increase in delay of the output signal. Meanwhile, the p-type transistor could be increased in size to complement the driving capability of the transistor to reduce the delay of the output signal; however, this is not preferable since the increase in size leads to an increase in circuit area.

The present disclosure intends to provide an output circuit capable of high speed operation without causing an increase in a circuit area.

SUMMARY

In an aspect of the present disclosure, an output circuit receives a data input signal and outputs an output signal which varies in accordance with the data input signal. The output circuit includes: an output terminal outputting the output signal; a p-type output transistor having a source connected to a first power source providing a first potential and a drain connected to the output terminal; a pre-driver connected to the first power source and a power source end supplied with a potential lower than the first potential, receiving a signal varying in accordance with the data input signal, and providing a gate signal to a gate of the p-type output transistor, the gate signal transiting between the first potential and the potential supplied to the power source end in accordance with the received signal; and a drive assist circuit connected to a second power source providing a second potential lower than the first potential, and supplying the second potential from an output node to the power source end, wherein the drive assist circuit receives as an assist signal the data input signal or a signal varying in accordance with the data input signal, and when the assist signal makes a first transition corresponding to the transition of the gate signal from a high level to a low level, the drive assist circuit performs an assist operation in which a potential at the output node is temporarily brought down from the second potential.

In this aspect, the output transistor of the output circuit has the source connected to the first power source providing the first potential and the drain connected to the output terminal. The pre-driver is connected to the first power source and the power source end supplied with a potential lower than the first potential. The pre-driver receives a signal varying in accordance with the data input signal, and provides the gate signal to the gate of the output transistor. This gate signal transits between the first potential and a potential at the power source end. The drive assist circuit supplies the second potential from the output node to the power source end. Moreover, the drive assist circuit receives as the assist signal the data input signal or a signal varying in accordance with the data input signal. Then, when the assist signal makes the first transition corresponding to the transition of the gate signal from the high level to the low level, the drive assist circuit performs the assist operation in which the potential at the output node is temporarily brought down from the second potential. Hence, when the gate signal transits from the high level to the low level, and the output transistor goes to the conductive state to drive the output signal, the assist operation of the drive assist circuit can temporarily raise the gate-source voltage of the output transistor. The temporal rise in the gate-source voltage can enhance the driving capability of the output transistor, contributing to an increase in transition speed of the output signal from the low level to the high level. Such features can achieve a high speed operation of the output circuit without increasing the size of the output transistor.

The present disclosure can implement an output circuit capable of high speed operation without causing an increase in a circuit area.

DETAILED DESCRIPTION

Embodiments will be described below in detail with reference to the drawings. Note that the circuit diagrams below are simplified, mainly illustrating constituent elements of the present disclosure. Hence, illustrated constituent elements seemingly make a direct connection with each other. In an actual circuit configuration, however, these elements may be connected indirectly with each other because there may be another constituent element provided between the elements.

First Embodiment

Figure 1:
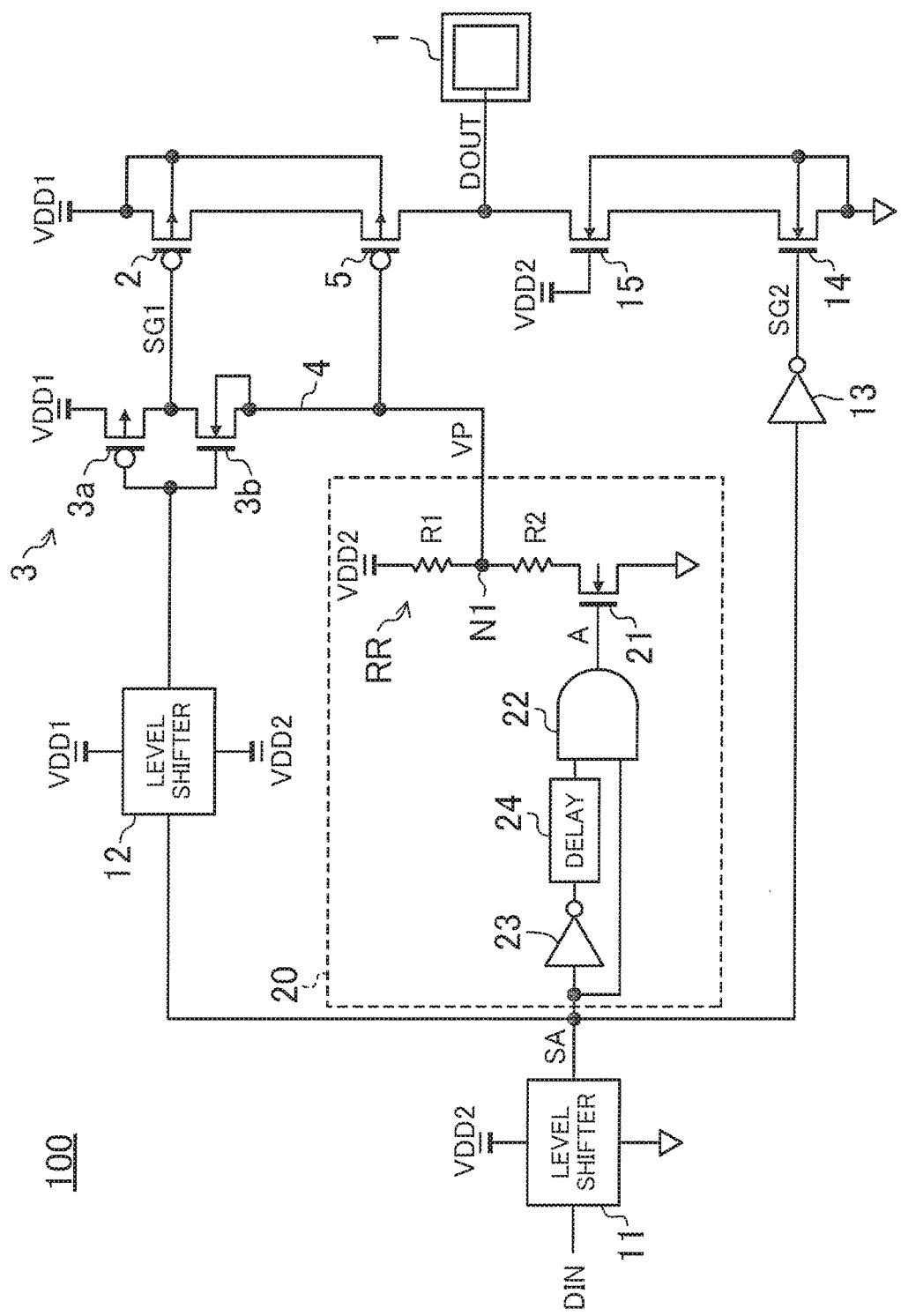
FIG. 1 is a circuit diagram of an output circuit according to a first embodiment.

FIG. 1 is a circuit diagram of an output circuit according to a first embodiment. An output circuit 100 in FIG. 1 receives a data input signal DIN, and outputs an output signal DOUT which varies in accordance with this data input signal DIN. The output signal DOUT is output from an output terminal 1. This output circuit 100 is provided, for example, to a signal output unit of a large-scale integrated circuit (LSI). In this case, an output pad of the LSI corresponds to the output terminal 1.

The output circuit 100 is connected to a first power source VDD1 and a second power source VDD2. Note that, in the specification of the present application, the reference signs "VDD1" and "VDD2" denote both the power sources themselves and the potentials provided from the power sources. The first potential VDD1 is, for example, 3.3 V, and the second potential VDD2 is lower than the first potential VDD1 to be, for example, 1.8 V. The data input signal DIN has a low amplitude, and transits between a ground potential GND and a potential of 0.9 V, for example. The output signal DOUT transits between the ground potential GND and the first potential VDD1.

The output circuit 100 includes level shifters 11 and 12, inverters 3 and 13, p-type transistors 2 and 5, and n-type transistors 14 and 15. Each of the transistors is a metal oxide semiconductor field effect transistor (MOSFET). The level shifter 11 receives the data input signal DIN having a low amplitude, converts the data input signal DIN into a signal SA to transit between the ground potential GND and the second potential VDD2, and outputs the signal SA. The level shifter 12 converts the signal SA into a signal to transit between the second potential VDD2 and the first potential VDD1, and provides the signal to the inverter 3.

The inverter 3 includes a p-type transistor 3a and an n-type transistor 3b, and is connected to the first power source VDD1 and a power source end 4 supplied with a potential VP lower than the first potential VDD1. The p-type transistor 3a has a gate and a drain respectively connected to a gate and a drain of the n-type transistor 3b. The inverter 3 as an example of a pre-driver inverts the signal from the level shifter 12, and provides the inverted signal as a gate signal SG1 to a gate of the p-type transistor 2. The gate signal SG1 transits between the first potential VDD1 and the potential VP at the power source end 4. Note that, usually, the second potential VDD2 is supplied as the potential VP.

The p-type transistor 2 as an output transistor has a source connected to the first power source VDD1 and a drain connected to the output terminal 1 via the p-type transistor 5. Specifically, the p-type transistor 2 is connected in a cascade to the output terminal 1. When the gate signal SG1 transits from the high level (VDD1) to the low level (VP), the p-type transistor 2 changes from a non-conductive state to a conductive state. Hence, the potential of the output signal DOUT is brought high toward the first potential VDD1, and the output signal DOUT transits to the high level (VDD1).

Moreover, the inverter 13 inverts the signal SA, and provides the inverted signal as a gate signal SG2 to a gate of the n-type transistor 14. The n-type transistor 14 has a source grounded and a drain connected to the output terminal 1 via the n-type transistor 15. When the gate signal SG2 transits from the low level (GND) to the high level (VDD2), the n-type transistor 14 changes from a non-conductive state to a conductive state. Hence, the potential of the output signal DOUT is brought low toward the ground potential GND, and the output signal DOUT transits to the low level (GND).

The output circuit 100 further includes a drive assist circuit 20. The drive assist circuit 20 is connected to the second power source VDD2, and supplies the potential VP from an output node N1. The output node N1 is connected to the power source end 4, and also to a gate of the p-type transistor 5. When not performing an assist operation, the drive assist circuit 20 outputs from the output node N1 the second potential VDD2 as the potential VP. Details of the assist operation will be described later. Here, since the second potential VDD2 is supplied from the drive assist circuit 20 to the power source end 4, the gate signal SG1 to be output from the inverter 3 transits between the first potential VDD1 and the second potential VDD2. Moreover, when the signal SA as an assist signal transits from the low level to the high level, the drive assist circuit 20 performs the assist operation in which the potential VP at the output node N1 is temporarily brought down from the second potential VDD2. Here, the transition of the signal SA from the low level to the high level corresponds to the transition of the gate signal SG1, to be output from the inverter 3, from the high level to the low level.

The drive assist circuit 20 specifically includes: an n-type transistor 21 having a source grounded; an AND gate 22; an inverter 23 receiving the signal SA; a delay circuit 24 receiving an output signal from the inverter 23; and a resistor string RR having resistors R1 and R2 connected in series between the second power source VDD2 and the drain of the n-type transistor 21. A connection node between the resistors R1 and R2 is the output node N1 of the drive assist circuit 20. The AND gate 22 receives the signal SA and the output from the delay circuit 24, and provides an output A to a gate of the n-type transistor 21. After the signal SA transits from the low level to the high level, the output A is brought to the high level for a predetermined time period. Specifically, the AND gate 22, the inverter 23, and the delay circuit 24 constitute a pulse generation circuit. When the signal SA transits from the low level to the high level, the pulse generation circuit outputs a pulse having a predetermined pulse width. When the output A is in the low level, the n-type transistor 21 is in a non-conductive state. In this state, the potential VP of the output node N1 is the second potential VDD2. Meanwhile, when the output A is in the high level, the n-type transistor 21 is in a conductive state. In this state, the potential VP at the output node N1 is a potential (i.e., referred to as "potential Va" in this state) obtained when the second potential VDD2 is divided by a resistance ratio of the resistor R1 to the resistor R2. The n-type transistor 21 is an example of a switching element to be in the conductive state when the pulse generation circuit outputs the pulse and to be in the non-conductive state when the pulse generation circuit does not output the pulse.

Figure 2:
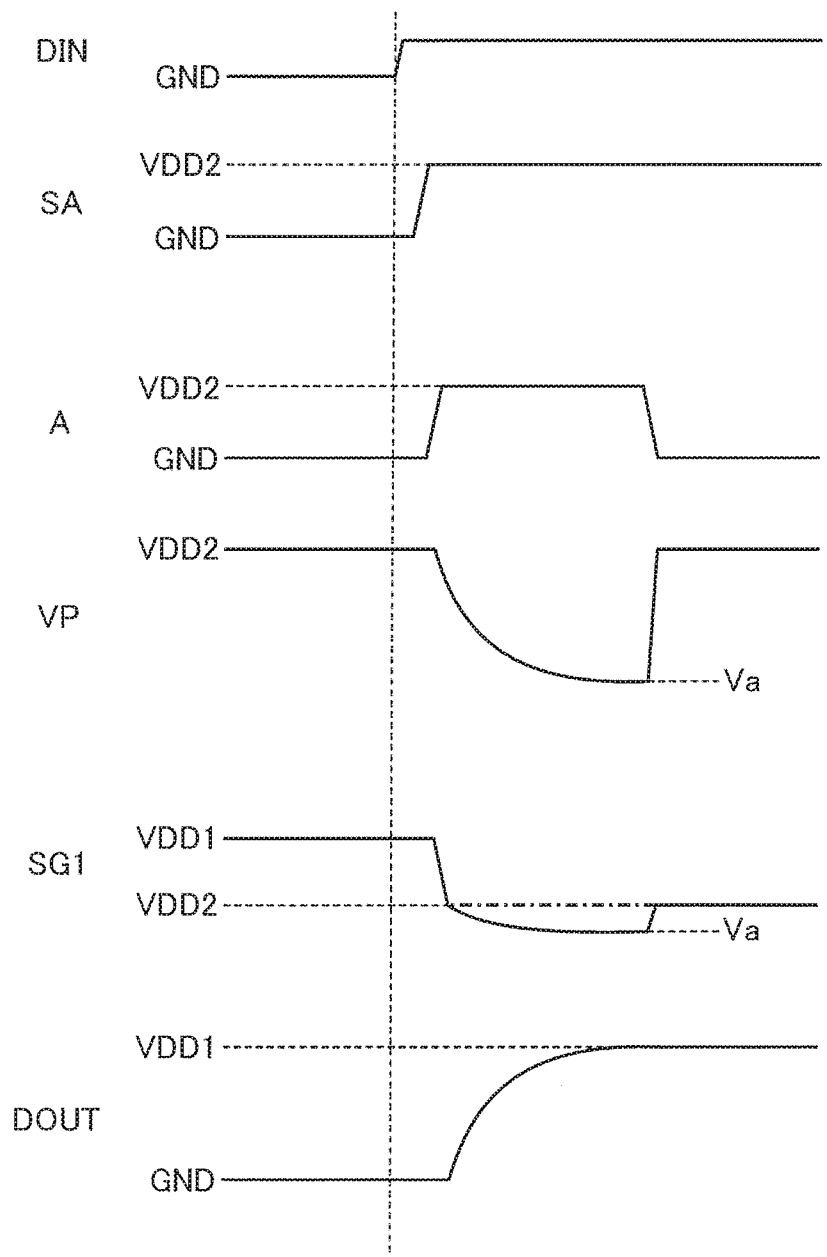
FIG. 2 is a waveform chart illustrating an operation of the output circuit of FIG. 1.

An operation of the circuit in FIG. 1 is described with reference to a waveform chart in FIG. 2. In FIG. 2, for the sake of easy comprehension, a variation of the potential VP alone is illustrated approximately four times as large as variations of other signals and potentials.

When the data input signal DIN is in the low level, the signal SA to be output from the level shifter 11 is in the low level (GND). In this state, the gate signal SG1 to be output from the inverter 3 is in the high level (VDD1), and the p-type transistor 2 is in the non-conductive state. Meanwhile, the gate signal SG2 (not shown) to be output from the inverter 13 is in the high level (VDD2), and the n-type transistor 14 is in the conductive state. As a result, the output signal DOUT is in the low level (GND). Moreover, in the drive assist circuit 20, the output A is kept in the low level (GND), and the n-type transistor 21 is in the non-conductive state. Hence, the potential VP at the output node N1 is maintained at the second potential VDD2.

When the data input signal DIN transits to the high level, the signal SA to be output from the level shifter 11 transits to the high level (VDD2). Hence, the gate signal SG1 to be output from the inverter 3 transits to the low level, and the p-type transistor 2 starts to raise the potential of the output signal DOUT. Note that, in the drive assist circuit 20, the output A is in the high level for a predetermined time period. When the output A is in the high level, the n-type transistor 21 is in the conductive state. Thus, the potential VP at the output node N1 drops from the second potential VDD2 toward the potential Va. Hence, the potential at the power source end 4 drops from the second potential VDD2. As a result, the potential of the gate signal SG1 to be output from the inverter 3 further drops from the second potential VDD2. When the output A goes back to the low level, the n-type transistor 21 is brought to the non-conductive state. Hence, the potential VP at the output node N1 goes back to the second potential VDD2, and the potential of the gate signal SG1 also goes back to the second potential VDD2.

Specifically, when the data input signal DIN transits from the low level to the high level, the potential of the gate signal SG1 provided to the p-type transistor 2 is further brought down for a predetermined time period from the second potential VDD2 to be supplied from an external power source. Hence, the gate-source voltage in the p-type transistor 2 can be temporarily raised such that a capability to drive the output signal DOUT with the p-type transistor 2 can be enhanced. The enhanced capability can increase a transition speed of the output signal DOUT from the low level to the high level.

Moreover, the configuration in FIG. 1 makes it possible to address variation of the first potential VDD1 and the second potential VDD2 to be supplied from an external power source. Specifically, when the first potential VDD1 drops and the second potential VDD2 rises, the gate-source voltage of the p-type transistor 2 drops, causing a decrease in driving capability. In this embodiment, however, the gate-source voltage of the p-type transistor 2 can be sufficiently increased for a predetermined time period since the transition of the gate signal SG1 from the high level to the low level.

In the output circuit 100 of this embodiment, when the assist signal SA makes a first transition corresponding to the transition of the gate signal SG1 from the high level to the low level, the drive assist circuit 20 performs an assist operation in which the potential VP of the output node N1 is temporarily brought down from the second potential VDD2. Hence, when the gate signal SG1 transits from the high level to the low level, and the p-type transistor 2 goes to the conductive state to drive the output signal DOUT, the assist operation of the drive assist circuit 20 can temporarily raise the gate-source voltage of the p-type transistor 2. The temporal increase in the gate-source voltage can enhance the driving capability of the p-type transistor 2, contributing to an increase in transition speed of the output signal DOUT from the low level to the high level. Such features can achieve a high speed operation of the output circuit 100 without increasing the size of the p-type transistor 2.

Note that, in the configuration in FIG. 1, the resistor string RR includes, but not limited to, the two resistors R1 and R2. For example, multiple resistors connected in series may constitute the resistor string RR, and any given connection node between the resistors themselves may be designated as the output node N1. Moreover, a resistor included in the resistor string RR may be implemented, for example, in a combination of multiple resistor elements. Alternatively, the resistor may be implemented, using a transistor resistor.

Furthermore, in the configuration in FIG. 1, the level shifter 12 is to receive the first potential VDD1 and the second potential VDD2. Alternatively, the level shifter 12 may receive the potential VP to be supplied to the power source end 4, instead of the second potential VDD2.

Second Embodiment

Figure 3:
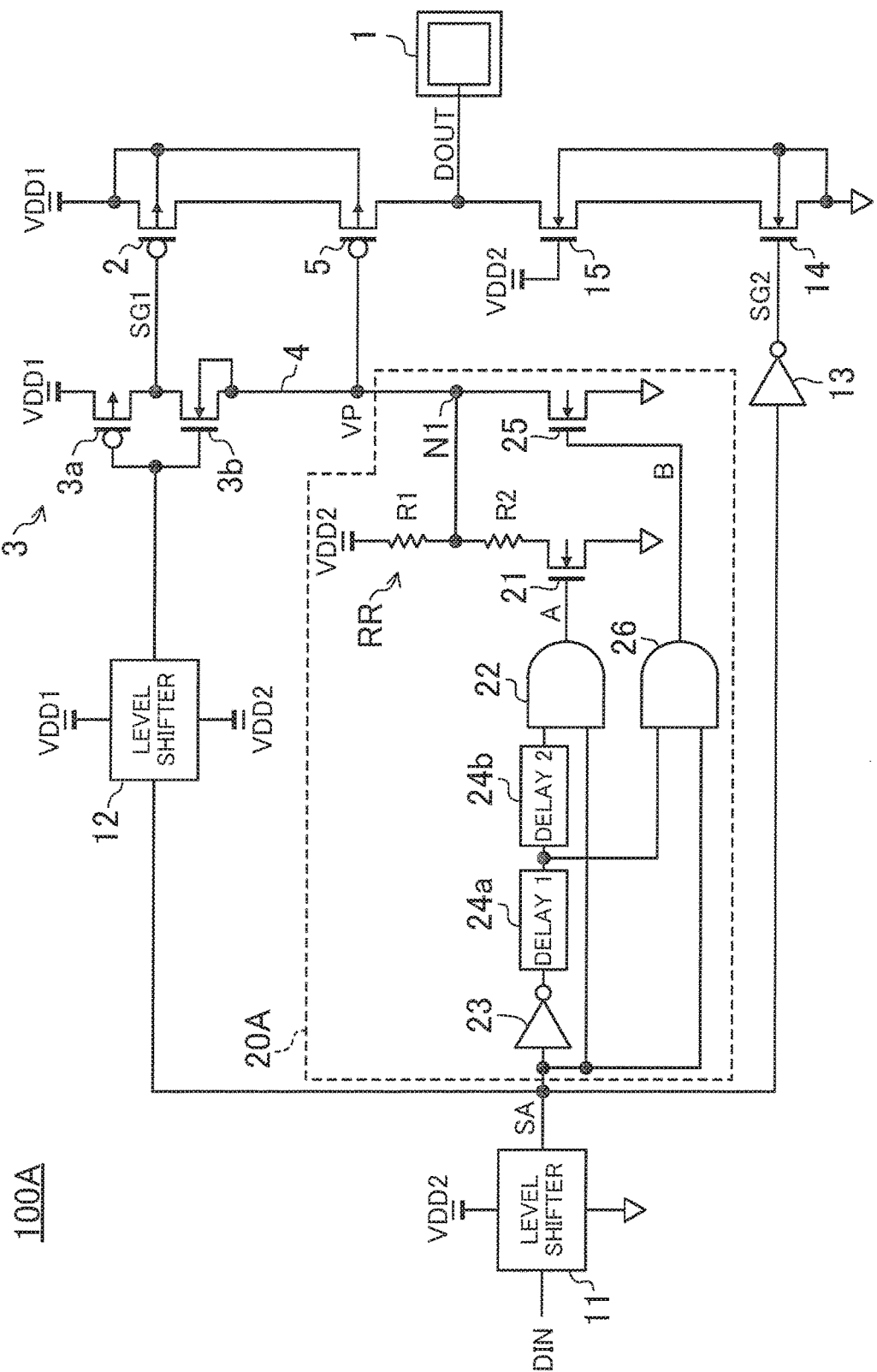
FIG. 3 is a circuit diagram of an output circuit according to a second embodiment.

FIG. 3 is a circuit diagram of an output circuit according to a second embodiment. An output circuit 100A in FIG. 3 is almost the same in configuration as the output circuit 100 in FIG. 1. Detailed explanations of the previously described features may be omitted.

The output circuit 100A in FIG. 3 is different in internal configuration of a drive assist circuit 20A from the output circuit 100 in FIG. 1. The drive assist circuit 20A includes: the n-type transistor 21 having the source grounded; the AND gate 22; the inverter 23 receiving the signal SA; a delay circuit 24a receiving the output signal from the inverter 23; a delay circuit 24b receiving an output signal from the delay circuit 24a; and the resistor string RR having resistors R1 and R2 connected in series between the second power source VDD2 and the drain of the n-type transistor 21. The output node N1 of the drive assist circuit 20A is connected to the connection node between the resistors R1 and R2. The AND gate 22 receives the signal SA and an output from the delay circuit 24b, and provides the output A to the gate of the n-type transistor 21. Moreover, the drive assist circuit 20A further includes an n-type transistor 25 and an AND gate 26. The n-type transistor 25 has a source grounded and a drain connected to the output node N1. The AND gate 26 receives the signal SA and an output from the delay circuit 24a, and provides an output B to a gate of the n-type transistor 25.

Specifically, the AND gate 22, the inverter 23, and the delay circuits 24a and 24b constitute a pulse generation circuit. When the signal SA transits from the low level to the high level, the pulse generation circuit outputs a pulse having a predetermined pulse width. Moreover, the AND gate 26, the inverter 23, and the delay circuit 24a constitute a second pulse generation circuit. When the signal SA transits from the low level to the high level, the second pulse generation circuit outputs a second pulse. The second pulse output from the second pulse generation circuit is shorter in pulse width than the pulse output from the pulse generation circuit. Furthermore, the n-type transistor 25 is an example of a second switching element to be in a conductive state when the second pulse generation circuit outputs the second pulse and to be in the non-conductive state when the second pulse generation circuit does not output the second pulse.

In this embodiment, the drive assist circuit 20A brings down the potential VP at the output node N through two paths; namely, a path through the n-type transistor 21 and a path through the n-type transistor 25.

Figure 4:
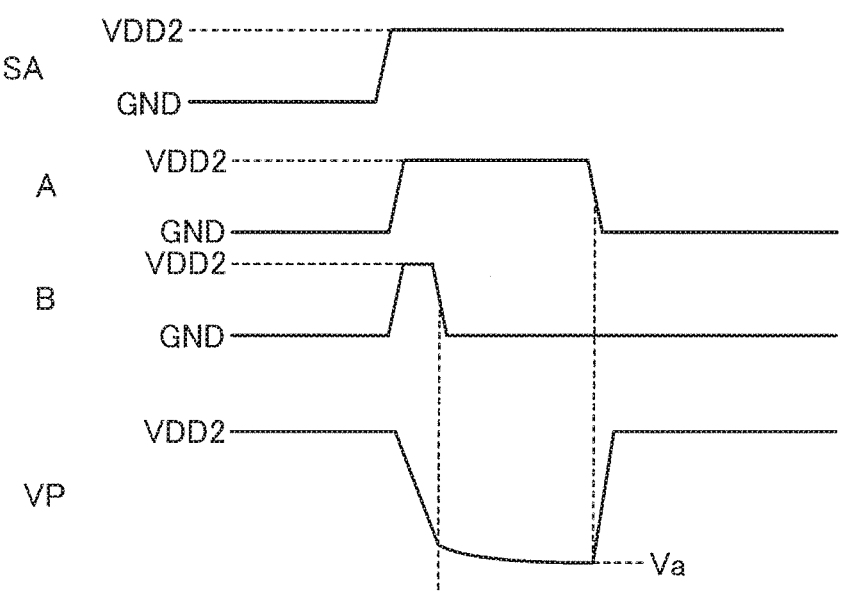
FIG. 4 is a waveform chart illustrating an operation of the output circuit in FIG. 3.

As illustrated in a waveform chart in FIG. 4, after the signal SA transits from the low level to the high level, the output A is brought to the high level for a predetermined time period. Moreover, after the signal SA transits from the low level to the high level, the output B is brought to the high level for a time period shorter than the output A is. Hence, at the beginning of the transition of the signal SA from the low level to the high level, both of the outputs A and B are in the high level. Hence, both of the n-type transistors 21 and 25 are in the conductive state. Hence, the potential VP of the output node N1 is brought down at a high speed. Then, when the output B goes to the low level, the n-type transistor 25 goes to the non-conductive state. Hence, the potential VP at the output node N1 is brought down by the n-type transistor 21 alone. Then, the potential VP becomes the potential Va obtained when the second potential VDD2 is divided by a resistance ratio of the resistor R1 to the resistor R2.

In this embodiment, similar to the first embodiment, when the data input signal DIN transits from the low level to the high level, the potential of the gate signal SG1 that the p-type transistor 2 receives is further brought down for a predetermined time period from the second potential VDD2 to be supplied from an external power source. Hence, the gate-source voltage in the p-type transistor 2 can be temporarily raised such that a capability to drive the output signal DOUT with the p-type transistor 2 can be enhanced. The enhanced capability can increase a transition speed of the output signal DOUT from the low level to the high level.

Moreover, in this embodiment, the potential VP at the output node N1 can be brought down at a high speed with high precision. In the configuration according to the first embodiment, when the potential VP is to be brought down at a high speed, resistivity of the resistors R1 and R2 in the resistor string RR needs to be low. However, in a semiconductor device, lowering resistivity requires a larger element size, causing an increase in circuit area. In this embodiment, the potential VP can be brought down by the n-type transistor 25 at a high speed, and eventually, the potential Va can be precisely set by the resistor string RR. Hence, the resistors R1 and R2 in the resistor string RR may be left high in resistivity, contributing to curbing an increase in the circuit area.

Third Embodiment

Figure 5:
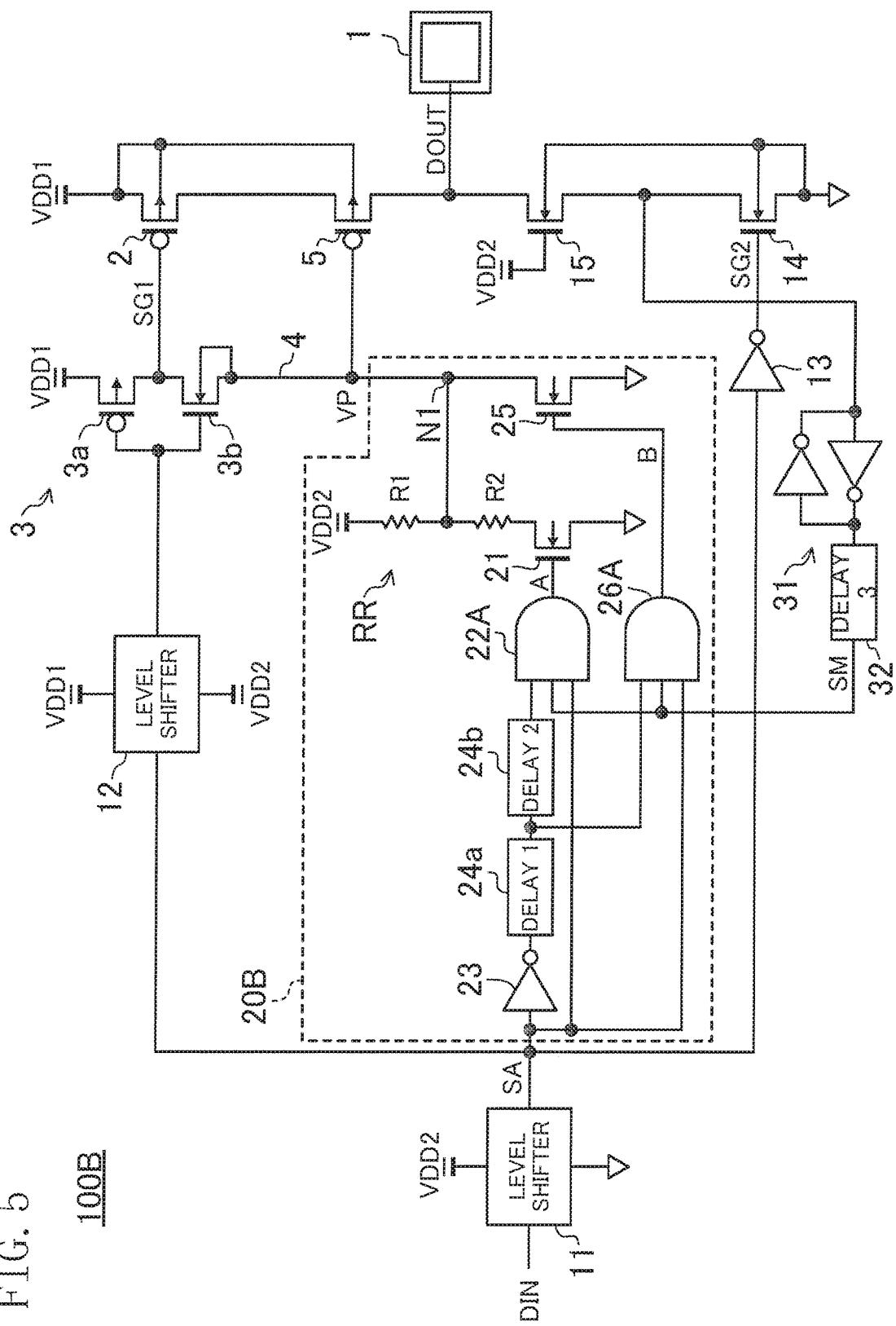
FIG. 5 is a circuit diagram of an output circuit according to a third embodiment.

FIG. 5 is a circuit diagram of an output circuit according to a third embodiment. An output circuit 100B in FIG. 5 is almost the same in configuration as the output circuit 100A in FIG. 3. Detailed explanations of the previously described features may be omitted.

Compared with the output circuit 100A in FIG. 3, the output circuit 100B in FIG. 5 provides a drive assist circuit 20B with a variation of the output signal DOUT as feedback. The drive assist circuit 20B has a 3-input AND gate 22A and 26A instead of the AND gates 22 and 26 included in the drive assist circuit 20A in FIG. 3. Then, the output circuit 100B includes: a latch circuit 31 receiving a potential at a connection node between the n-type transistors 14 and 15; and a delay circuit 32 receiving an output of the latch circuit 31. The delay circuit 32 outputs a signal SM. Acting as a monitor signal to detect the variation of the output signal DOUT, the signal SM is provided to the 3-input AND gate 22A and 26A as a single input. The latch circuit 31 and the delay circuit 32 constitute a monitor circuit monitoring the variation of the output signal DOUT and outputting the monitor signal SM varying in accordance with the output signal DOUT.

Figure 6:
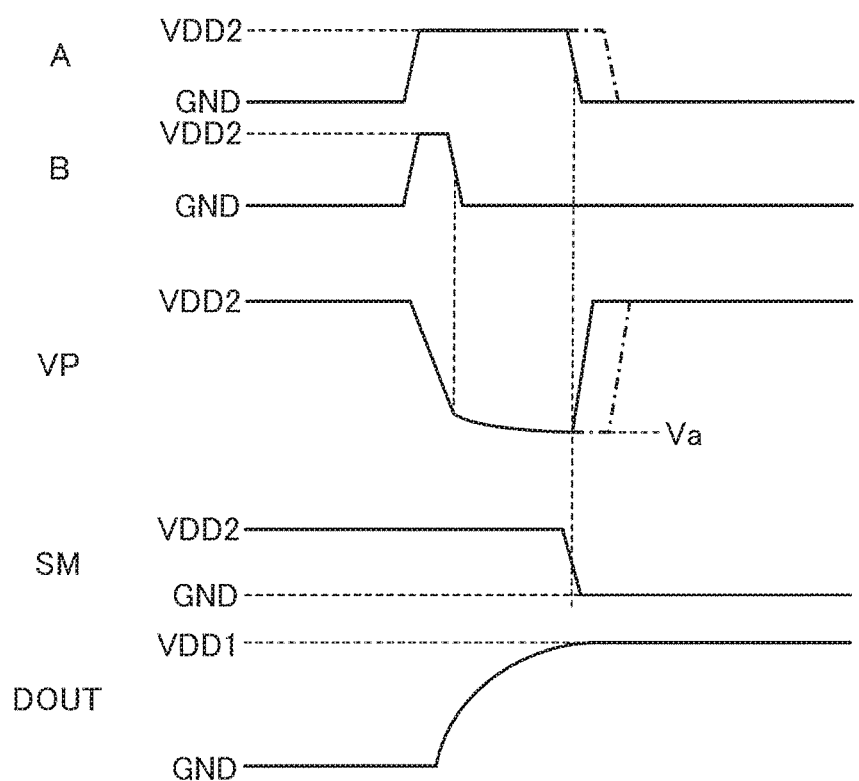
FIG. 6 is a waveform chart illustrating an operation of the output circuit in FIG. 5.

As illustrated in a waveform chart in FIG. 6, when the potential at the connection node between the n-type transistors 14 and 15 rises to a predetermined level while the output signal DOUT transits from the low level to the high level, the signal SM transits from the high level to the low level. Note that timing of the transition is adjusted by the delay circuit 32. The variation of this signal SM indicates that the output signal DOUT has transited from the low level to the high level. As described in the second embodiment, the potential VP at the output node N1 in the drive assist circuit 20B is brought down after the signal SA has transited from the low level to the high level. However, when the signal SM transits from the high level to the low level, outputs A and B from the 3-input AND gate 22A and 26A are forced to be brought down to the low level. The potential VP at the output node N1 is brought back to the second potential VDD2.

Specifically, when the signal SM is provided to the drive assist circuit 20B as feedback, and, as a result, the output signal DOUT is driven at a high speed, the assist operation performed by the drive assist circuit 20B can be suspended. Such a feature can reduce unnecessary power consumption of the drive assist circuit 20B.

Note that, in this embodiment, the variation of the output signal DOUT is detected through, but not limited to, monitoring the potential at the connection node between the n-type transistors 14 and 15. For example, the output signal DOUT may be directly monitored. Alternatively, if the LSI includes a circuit receiving the output signal DOUT, the variation of the output signal DOUT may be monitored at the circuit.

Moreover, as a matter of course, in the first embodiment and other configurations, the variation in the output signal DOUT may be provided as feedback, as disclosed in this embodiment.

Fourth Embodiment

Figure 7:
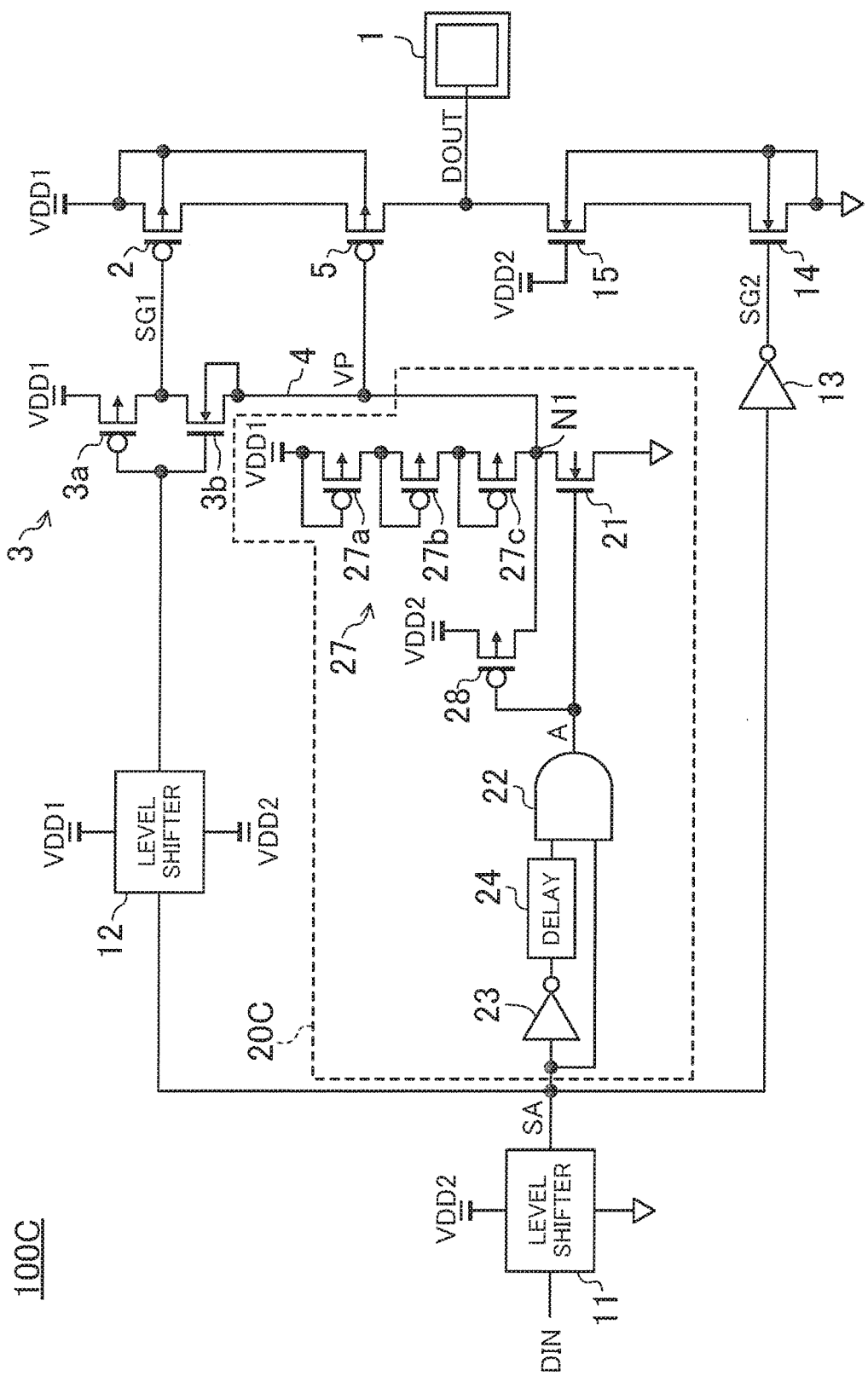
FIG. 7 is a circuit diagram of an output circuit according to a fourth embodiment.

FIG. 7 is a circuit diagram of an output circuit according to a fourth embodiment. An output circuit 100C in FIG. 7 is almost the same in configuration as the output circuit 100 in FIG. 1. Detailed explanations of the previously described features may be omitted.

The output circuit 100C in FIG. 7 is different in internal configuration of a drive assist circuit 20C from the output circuit 100 in FIG. 1. Similar to the drive assist circuit 20 in FIG. 1, the drive assist circuit 20C includes: the n-type transistor 21 having the source grounded; the AND gate 22; the inverter 23 receiving the signal SA; and the delay circuit 24 receiving an output signal from the inverter 23. The AND gate 22 receives the signal SA and an output from the delay circuit 24, and provides the output A to the gate of the n-type transistor 21. The drain of the n-type transistor 21 acts as the output node N1. The drive assist circuit 20C further includes: a diode string 27 having p-type transistors 27a, 27b, 27c diode-connected; and a p-type transistor 28. The diode string 27 has one end connected to the first power source VDD1, and another end connected to the output node N1. The p-type transistor 28 is provided between the second power source VDD2 and the output node N1, and has a gate supplied with the output A from the AND gate 22.

When the data input signal DIN is in the low level, the signal SA is in the low level. Here, in the drive assist circuit 20C, the output A is left in the low level. Thus, the n-type transistor 21 is in the non-conductive state, and the p-type transistor 28 is in the conductive state. Hence, the potential VP at the output node N1 is maintained at the second potential VDD2.

When the data input signal DIN transits to the high level and the signal SA transits to the high level, the output A in the drive assist circuit 20C stays in the high level for a predetermined time period as described in the first embodiment. When the output A is in the high level, the n-type transistor 21 is in the conductive state and the p-type transistor 28 is in the non-conductive state. In these states, the potential VP at the output node N1 is the same as the first potential VDD1 decreased by a potential corresponding to a sum of threshold voltages of the p-type transistors 27a, 27b, 27c.

Here, when the first potential VDD1 to be supplied from an external power source drops, accordingly, the potential VP at the output node N1 drops further. Moreover, when the second potential VDD2 to be supplied from the external power source rises, the gate potential of the n-type transistor 21 rises. Hence, the potential VP at the output node N1 drops further. Specifically, along with the drop of the first potential VDD1 and the rise of the second potential VDD2, the potential VP at the output node N1 drops further. Hence, the gate-source voltage of the p-type transistor 2 rises further. Thus, even when the first potential VDD1 drops and the second potential VDD2 rises, such a feature can curb a decrease in driving capability of the p-type transistor 2.

Moreover, this embodiment can address variations in manufacturing process. Specifically, when threshold voltages of the transistors are high because of the manufacturing process, and thus the transistors are slow in operation speed, the sum of the threshold voltages of the p-type transistors 27a, 27b, 27c becomes larger such that the potential VP of the output node N becomes lower. Meanwhile, when threshold voltages of the transistors are low because of the manufacturing process, and thus the transistors are fast in operation speed, the sum of the threshold voltages of the p-type transistors 27a, 27b, 27c becomes smaller such that the potential VP of the output node N1 does not become very low. Specifically, the slower the operation speeds of the transistors are, the higher the gate-source voltage of the p-type transistor 2 is. Hence, a decrease in the driving capability of the p-type transistor 2 can be appropriately curbed, depending on the manufacturing process.

Note that, in the configuration in FIG. 7, the diode string 27 includes, but not limited to, three p-type transistors 27a, 27b, 27c. Alternatively, the diode string 27 may include one or more diode-connected p-type transistors in series.

Figure 8:
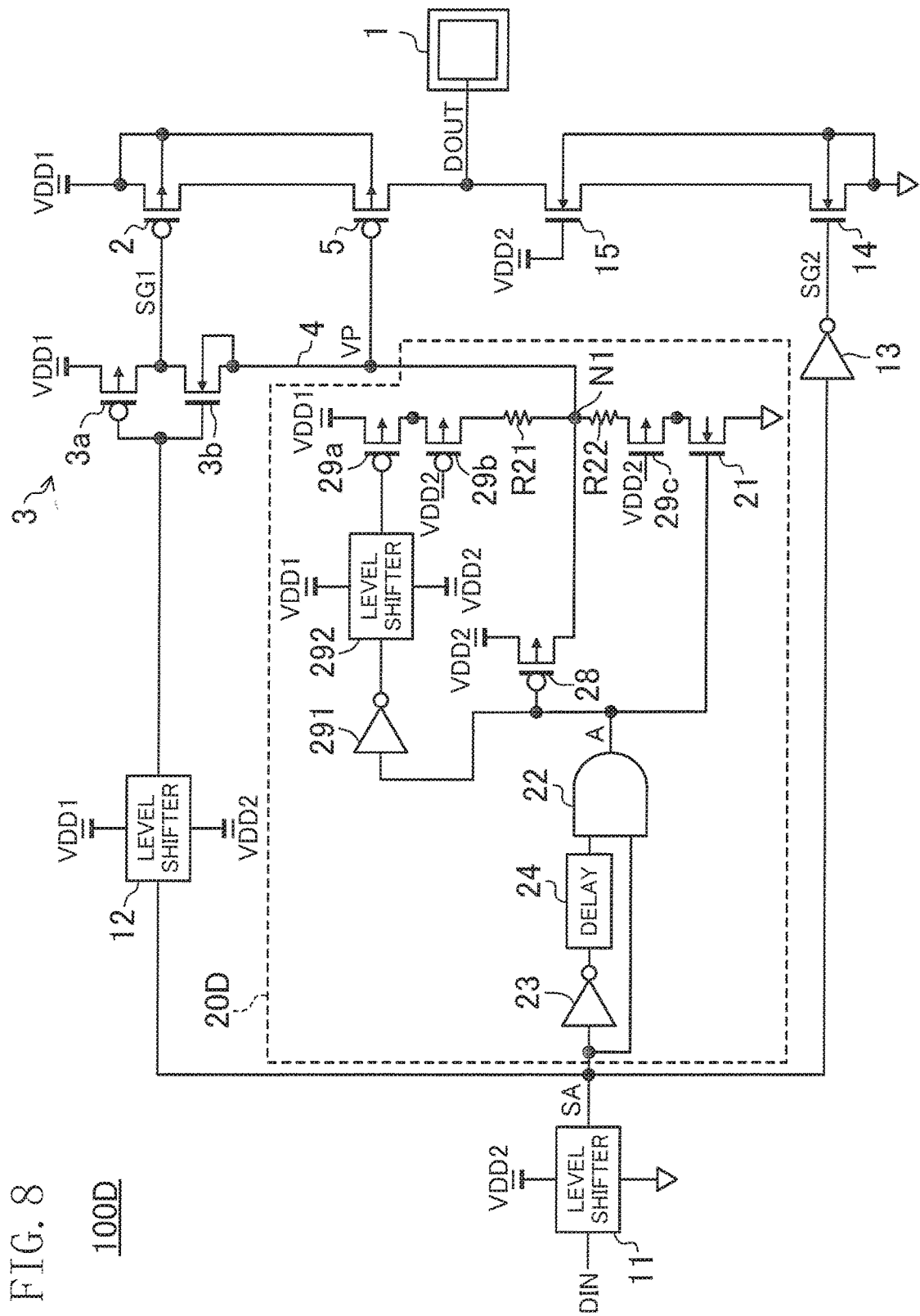
FIG. 8 is a circuit diagram in another example of the output circuit according to the fourth embodiment.

FIG. 8 is a circuit diagram in another example of the output circuit according to the fourth embodiment. In the output circuit 100D in FIG. 8, similar to the drive assist circuit 20C in FIG. 7, the drive assist circuit 20D is configured so that the potential VP at the output node N1 in the assist operation drops along with the drop of the first potential VDD1. Specifically, similar to the drive assist circuit 20C in FIG. 7, the drive assist circuit 20D includes: the n-type transistor 21 having the source grounded; the AND gate 22; the inverter 23 receiving the signal SA; the delay circuit 24 receiving an output signal from the inverter 23; and the p-type transistor 28 provided between the second power source VDD2 and the output node N1. The AND gate 22 receives the signal SA and an output from the delay circuit 24, and provides the output A to the gates of the n-type transistor 21 and the p-type transistor 28. The drive assist circuit 20D further includes: an inverter 291 receiving the output A from the AND gate 22; a level shifter 292 receiving an output from the inverter 291; p-type transistors 29a and 29b; an n-type transistor 29c; and resistors R21 and R22 connected in series. The p-type transistors 29a and 29b, the resistors R21 and R22, and the n-type transistors 29c and 21 are connected in the stated order between the first power source VDD1 and a grounded power source. A connection node between the resistors R21 and R22 acts as the output node N1 of the drive assist circuit 20D. The p-type transistor 29a has a gate provided with an output from the level shifter 292. Each of the p-type transistor 29b and the n-type transistor has a gate provided with the second potential VDD2.

When the data input signal DIN is in the low level, the signal SA is in the low level. Here, in the drive assist circuit 20D, the output A is left in the low level. Hence, both the p-type transistor 29a and the n-type transistor 21 are in the non-conductive state. Hence, the potential VP at the output node N1 is maintained at the second potential VDD2.

When the data input signal DIN transits to the high level, and the signal SA transits to the high level, the output A in the drive assist circuit 20D stays in the high level for a predetermined time period, as described in the first embodiment. When the output A is in the high level, the p-type transistor 29a and the n-type transistor 21 are in the conductive state, and the p-type transistor 28 is in the non-conductive state. Hence, the potential VP at the output node N1 is the first potential VDD1 divided by the resistors R21 and R22.

Here, when the first potential VDD1 to be supplied from an external power source drops, accordingly, the potential VP at the output node N1 drops further. Specifically, along with the drop of the first potential VDD1, the potential VP at the output node N1 drops further. Hence, the gate-source voltage of the p-type transistor 2 rises further. Thus, even when the first potential VDD1 drops, a decrease in driving capability of the p-type transistor 2 can be curbed.

Moreover, in the configuration of this embodiment, the potential VP at the output node N1 may be brought down through two paths as described in the second embodiment. Furthermore, in the configuration of this embodiment, the variation in the output signal DOUT may be provided as feedback, as disclosed in the third embodiment.

Other Embodiments

In the embodiments, the p-type transistor 2 driving the output signal DOUT is connected in a cascade to the output terminal 1 via the p-type transistor 5 in view of preventing a voltage of the p-type transistor 2 from exceeding a breakdown voltage. However, the present disclosure shall not be limited to this configuration.

Figure 9:
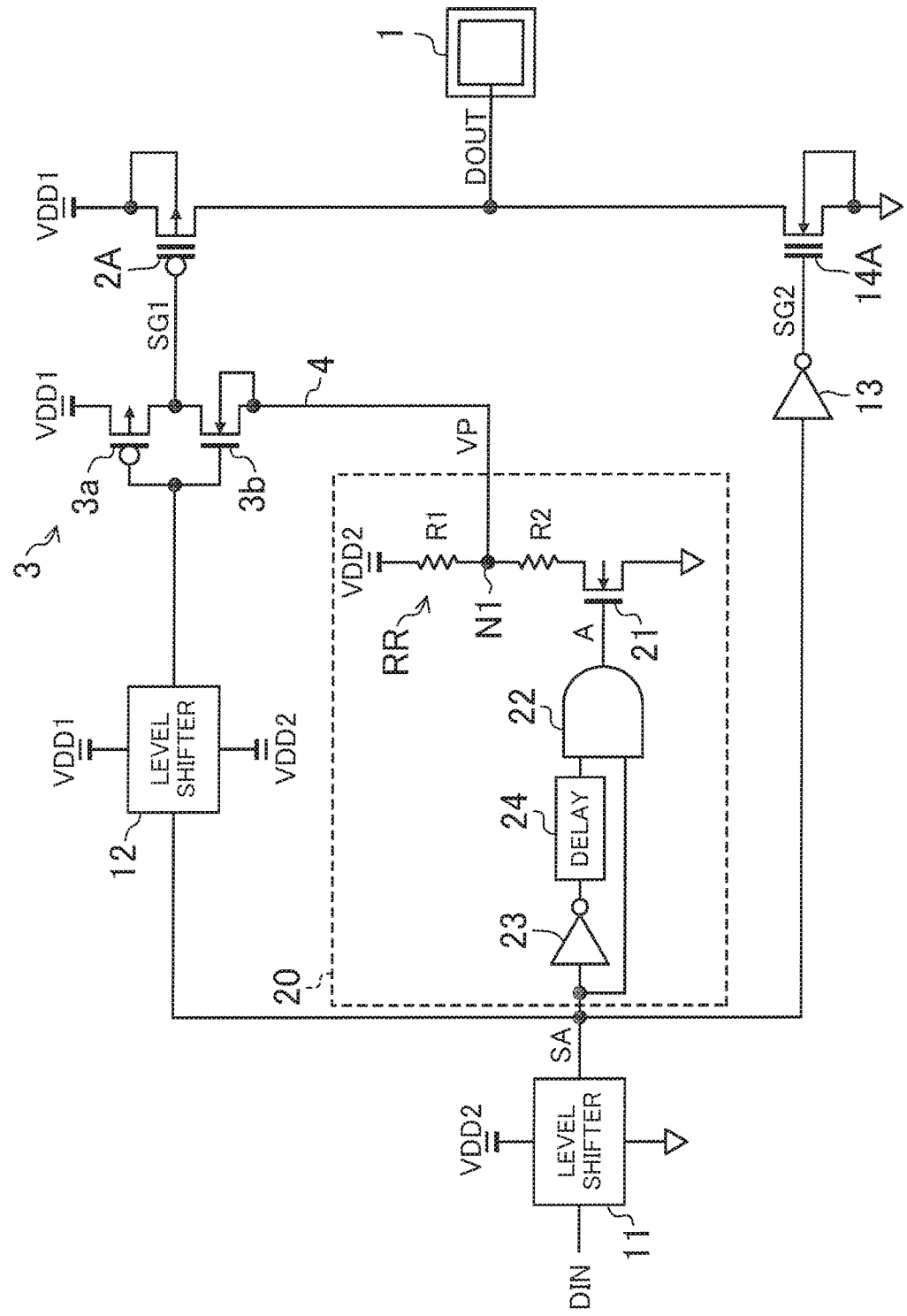
FIG. 9 is a circuit diagram of an output circuit according to another embodiment.

For example, an output circuit in FIG. 9 is similar in configuration to the output circuit 100 in FIG. 1, using a high-voltage device. In the configuration in FIG. 9, a p-type transistor 2A, acting as an output transistor driving the output signal DOUT, is directly connected to the output terminal 1. Moreover, an n-type transistor 14A, driving the output signal DOUT, is directly connected to the output terminal 1. Examples of the p-type transistor 2A and the n-type transistor 14A may include such a high-voltage device as a laterally diffused metal oxide semiconductor (LDMOS). The LDMOS has the same gate breakdown voltage and source breakdown voltage as, but a higher drain breakdown voltage than, a regular MOS has. The configuration in FIG. 9 with such a high-voltage device as the LDMOS makes it possible to implement an output circuit having a small area.

The configuration in FIG. 9 may be applied to the second to fourth embodiments. Note that, when the configuration is applied to the third embodiment, for example, the variation in the output signal DOUT may be monitored at a circuit receiving the output signal DOUT in the LSI.

Moreover, in the embodiments, the drive assist circuits 20, 20A, 20B, 20C, and 20D may receive, as an assist signal, the signal SA to be output from the level shifter 11. The assist signal received by the drive assist circuits may vary in accordance with the data input signal DIN. Alternatively, the assist signal may be the data input signal DIN itself.

Furthermore, in each of the embodiments, logical levels of the assist signal SA and the gate signal SG1 are inverted; however, the logical levels may be the same. In this case, the drive assist circuits may perform the assist operation when the assist signal transits from the high level to the low level. Specifically, the drive assist circuits may perform the assist operation when the assist signal transits in response to the transition of the gate signal from the high level to the low level; that is, when the p-type transistors driving an output signal switch from the non-conductive state to the conductive state.

Note that the present disclosure is not limited to the configurations disclosed in the above embodiments. The present disclosure may be modified in multiple ways within technical ideas of the present disclosure by those skilled in the art. Furthermore, the constituent elements in embodiments may be combined in any given manner within the scope of the present disclosure.

The present disclosure can implement an output circuit capable of high speed operation without causing an increase in a circuit area. Hence, the present disclosure is effective in, for example, increasing the speed of, and reducing the area of, an LSI.

What is claimed is:

1. An output circuit receiving a data input signal and outputting an output signal which varies in accordance with the data input signal, the output circuit comprising:
    an output terminal outputting the output signal;
    a p-type output transistor having a source connected to a first power source providing a first potential and a drain connected to the output terminal;
    a pre-driver connected to the first power source and a power source end supplied with a potential lower than the first potential, receiving a signal varying in accordance with the data input signal, and providing a gate signal to a gate of the p-type output transistor, the gate signal transiting between the first potential and the potential supplied to the power source end in accordance with the received signal; and
    a drive assist circuit connected to a second power source providing a second potential lower than the first potential and a third power source providing a third potential lower than the second potential, and supplying the second potential from an output node to the power source end, wherein
    the drive assist circuit receives as an assist signal the data input signal or a signal varying in accordance with the data input signal, and when the assist signal makes a first transition corresponding to the transition of the gate signal from a high level to a low level, the drive assist circuit performs an assist operation in which a potential at the output node is temporarily brought down from the second potential.

2. The output circuit of claim 1, wherein
    the drive assist circuit includes:
    a pulse generation circuit receiving the assist signal, and when the assist signal makes the first transition, outputting a pulse having a predetermined pulse width;
    a resistor string including resistors connected in series, and having one end connected to the second power source, one of connection nodes between the resistors being the output node; and
    a switching element provided between an other end of the resistor string and a grounded power source, and receiving an output from the pulse generation circuit, the switching element being (i) in a conductive state when the pulse generation circuit outputs the pulse and (ii) in a non-conductive state when the pulse generation circuit does not output the pulse.

3. The output circuit of claim 2, wherein
    the drive assist circuit includes:
    a second pulse generation circuit receiving the assist signal, and, when the assist signal makes the first transition, outputting a second pulse shorter in pulse width than the pulse; and
    a second switching element provided between the output node and the grounded power source, and receiving an output from the second pulse generation circuit, the second switching element being (i) in a conductive state when the second pulse generation circuit outputs the second pulse and (ii) in a non-conductive state when the second pulse generation circuit does not output the second pulse.

4. The output circuit of claim 1, further comprising:
    a monitor circuit monitoring a variation of the output signal, and outputting a monitor signal varying in accordance with the output signal, wherein
    the drive assist circuit receives the monitor signal, and
    after the drive assist circuit starts the assist operation when the assist signal makes the first transition, the drive assist circuit suspends the assist operation when the monitor signal shows a variation indicating a transition of the output signal from a low level to a high level.

5. The output circuit of claim 1, wherein the drive assist circuit is configured such that the potential at the output node in the assist operation drops along with a drop of the first potential.

6. The output circuit of claim 5, wherein
    the drive assist circuit includes:
    a pulse generation circuit receiving the assist signal, and when the assist signal makes the first transition, outputting a pulse having a predetermined pulse width and brought up to a high level;
    a diode string including one p-type diode-connected transistor or p-type diode-connected transistors connected in series, and having one end connected to the first power source and an other end acting as the output node;
    a p-type transistor provided between the second power source and the output node, and having a gate supplied with an output from the pulse generation circuit; and
    an n-type transistor provided between the output node and a grounded power source, and having a gate supplied with the output from the pulse generation circuit.

7. The output circuit of claim 1, wherein the drain of the p-type output transistor is connected in a cascade to the output terminal via an other transistor.

8. The output circuit of claim 1, wherein the drain of the p-type output transistor is directly connected to the output terminal.

9. The output circuit of claim 8, wherein the p-type output transistor is a laterally diffused metal oxide semiconductor (LDMOS).

10. An output circuit receiving a data input signal and outputting an output signal which varies in accordance with the data input signal, the output circuit comprising:

an output terminal outputting the output signal;

a p-type output transistor having a source connected to a first power source providing a first potential and a drain connected to the output terminal;

a pre-driver connected to the first power source and a power source end supplied with a potential lower than the first potential, receiving a signal varying in accordance with the data input signal, and providing a gate signal to a gate of the p-type output transistor, the gate signal transiting between the first potential and the potential supplied to the power source end in accordance with the received signal; and a drive assist circuit connected to a second power source providing a second potential lower than the first potential, and supplying the second potential from an output node to the power source end, wherein the drive assist circuit receives as an assist signal the data input signal or a signal varying in accordance with the data input signal, and when the assist signal makes a first transition corresponding to the transition of the gate signal from a high level to a low level, the drive assist circuit performs an assist operation in which a potential at the output node is temporarily brought down from the second potential, and the drain of the p-type output transistor is connected in a cascade to the output terminal via an other transistor.

11. The output circuit of claim 10, wherein the drive assist circuit includes:

a pulse generation circuit receiving the assist signal, and when the assist signal makes the first transition, outputting a pulse having a predetermined pulse width;

a resistor string including resistors connected in series, and having one end connected to the second power source, one of connection nodes between the resistors being the output node; and a switching element provided between an other end of the resistor string and a grounded power source, and receiving an output from the pulse generation circuit, the switching element being (i) in a conductive state when the pulse generation circuit outputs the pulse and (ii) in a non-conductive state when the pulse generation circuit does not output the pulse.

12. The output circuit of claim 11, wherein the drive assist circuit includes:

a second pulse generation circuit receiving the assist signal, and, when the assist signal makes the first transition, outputting a second pulse shorter in pulse width than the pulse; and a second switching element provided between the output node and the grounded power source, and receiving an output from the second pulse generation circuit, the second switching element being (i) in a conductive state when the second pulse generation circuit outputs the second pulse and (ii) in a non-conductive state when the second pulse generation circuit does not output the second pulse.

13. The output circuit of claim 10, further comprising:

a monitor circuit monitoring a variation of the output signal, and outputting a monitor signal varying in accordance with the output signal, wherein the drive assist circuit receives the monitor signal, and after the drive assist circuit starts the assist operation when the assist signal makes the first transition, the drive assist circuit suspends the assist operation when the monitor signal shows a variation indicating a transition of the output signal from a low level to a high level.

* * * * *